(12) United States Patent
Matsui

(10) Patent No.: US 6,249,150 B1
(45) Date of Patent: Jun. 19, 2001

(54) CLOCK SIGNAL GENERATOR CIRCUIT

(75) Inventor: Yoshinori Matsui, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/417,238

(22) Filed: Oct. 12, 1999

(30) Foreign Application Priority Data

Oct. 9, 1998 (JP) .................................................. 10-288332

(51) Int. Cl.[7] .................................................. H03K 3/017
(52) U.S. Cl. ........................... 326/93; 327/176; 327/174; 327/173
(58) Field of Search ............................... 326/93; 327/271, 327/291, 336, 344, 147, 276, 176, 299, 293, 295

(56) References Cited

U.S. PATENT DOCUMENTS

| 5,764,090 | * | 6/1998 | Yeh et al. | 327/174 |
| 5,844,438 | * | 12/1998 | Lee | 327/291 |
| 5,914,624 | * | 6/1999 | Son | 327/264 |
| 5,939,919 | * | 8/1999 | Proebsting | 327/295 |
| 6,114,891 | * | 9/2000 | Kim | 327/172 |

FOREIGN PATENT DOCUMENTS

| 52-50659 | 4/1977 | (JP) . |
| 9-214305 | 8/1997 | (JP) . |
| 10-144075 | 5/1998 | (JP) . |
| 10-228772 | 8/1998 | (JP) . |

* cited by examiner

*Primary Examiner*—Patrick Wamsley
*Assistant Examiner*—Vibol Tan
(74) *Attorney, Agent, or Firm*—Young & Thompson

(57) ABSTRACT

When a sub-clock signal is generated in synchronization with an external main clock signal from the main clock signal and its inverted delay signal, the signal width of the sub-clock signal is constant even when the high level or the low level of the main clock signal is shorter than the inverted delay time. A holding 20 circuit is provided so that a high level time period of the system clock signal CLK1 is extended beyond the delay time of the delay circuit 30. A complex gate including OR gates 25 and 27 is provided in a delay gate chain of a non-inversion in the holding circuit. If the high level width of the main clock signal CLK1 is not less than a time corresponding to four stages of the NAND gates 21 to 22, it is possible to extend the high level width of the gate chain output signal S28 to a time corresponding to twelve stages. A complex gate including NAND gates 31 and 32 is provided in the gate chain of the delay circuit 30 for the inversion and delay. The delay circuit is reset within a short time corresponding to four stages of NAND gates 31 to 37.

9 Claims, 8 Drawing Sheets

US 6,249,150 B1

CLOCK SIGNAL GENERATOR CIRCUIT

BACKGROUND OF THE INVENTION

The present invention relates to a clock signal generator circuit, and more particularly to a circuit for generating a sub-clock signal having a predetermined signal width and rising in synchronization with a given main clock signal by use of the given main clock signal and an inverted delay signal to the main clock signal.

Such clock signal generator circuits are, for example, used for generating clock signals from a system clock signal and supplying the generated clock signal to a device such as a synchronous dynamic random access memory which operates in synchronizing with the system clock signal used in a memory system having a synchronous dynamic random access memory.

An example of the conventional clock signal generator circuit is shown in FIG. 8. The first conventional clock signal generator circuit has a receiver circuit 1 for receiving and waveform-shaping a system clock signal CLK1 externally inputted so as to generate a waveform-shaped internal signal S10. The first conventional clock signal generator circuit also has a delay circuit 50 connected to the receiver circuit 1 for fetching the waveform-shaped internal signal S10 and delaying and inverting the same to generate an inverted delay signal S50. The first conventional clock signal generator circuit also has a NAND gate connected to the receiver circuit 1 and the delay circuit 50 for receiving the internal signal S10 and the inverted delay signal S50 to generate a NAND logic signal. The first conventional clock signal generator circuit also has an inverter buffer connected to the NAND gate for receiving the WAND logic signal to invert the same and generate a sub-clock signal CLK2c. The system clock signal is supplied as the clock signal CLKE into the receiver circuit 1, wherein the system clock signal is supplied from the synchronous dynamic random access memory. The generated sub-clock signal CLK2c is outputted as a time-reference signal for operations of the synchronous dynamic random access memory.

NAND gate and the inverter on the next stage form an AND gate logically, for which reason in the following descriptions, the above NAND gate and the inverter deal with the AND-gate 2. There is no signal delay in signal transmission in the circuit except when the signal is intentionally delayed as the delay circuit 50 described above. No signal delay is caused in the AND gate 2 and the receiver circuit 1. The receiver circuit 1 does not play any roll in the operational principal as will be apparent from the operations described blow.

The above clock signal generator operates as follows. With reference to FIG. 9 which shows a timing chart of the circuit, in an initial state (prior to a time t10), the system clock signal CLK1 is low level. The internal signal S10 is low level. The inverted delay signal S50 is high level. The sub-clock signal CLhc is low level. At the time t10, the internal signal S10 rises from the low level to high level, whereby one input of the AND gate 2 becomes high level, whilst another input as the inverted delay signal S50 to the AND gate 2 remains high level. Therefore, the sub-clock signal CLK2c from the AND gate 2 rises from the low level to the high level at the same time when the internal signal S10 rises to high level.

After the delay time "td" by 11-stages of the delay circuit 50 has passed and the time becomes t11, the internal signal S10 reaches an output point of the delay circuit 50, whereby the inverted delay signal S50 falls from the high level down to the low level, whereby the one input of the AND gate 2 becomes low level, and thus the sub-clock signal CLK2c falls from the high level down to the low level.

Finally, at a time "t12" decided by a high level width of the system clock signal, the internal signal S10 falls from the high level down to the low level. At a time "t13" delayed by a delay time "td" from the time "t12", the inverted delay signal S50 rises from the low level to the high level, whereby the circuit returns into the initial state.

From the externally supplied system clock signal CLK1 and the inverted delay signal S50 of the system clock signal CLK1, the sub-clock signal CLK2c is generated which rises in synchronizing with the rising of the system clock signal CLK1 and has a high level width corresponding to the delay time "td".

In the industrial view point, it is preferable that the clock signal generator circuit is general and applicable to various systems rather than specific to one particular system, because stable supply and mass-production for cost reduction are possible. In the above clock signal generator circuit, however, when the high level width of the system clock signal CLK1 is narrow or the low level width thereof is narrow, the sub-clock signal may be risen with delay from the rising of the system clock signal. Even if the sub-clock signal is risen at the normal timing without delay, the sub-clock signal is fallen prior to the delay time "td". Depending upon the system clock signal, the high level width of the sub-clock signal is different from the predetermined or intended width. There was an issue to solve the above problem for responsibility to various system.

With reference again to the timing chart shown in FIG. 9, operations from the time "t10" to the time "t13" are operations of an A-system, wherein the sub-clock signal is generated which has the normal rinsing time and the normal high level width by utilizing the clock signal generator circuit. The time sequence of the transitions in level of the system clock signal CLK1 and the inverted delay signal S50 in operation of the A-system are as follows.

① At the time "t10", the system clock signal CLK1 is risen.

② At the time "t11", the inverted delay signal SSO is fallen.

③ At the time "t12", the system clock signal CLK1 is fallen.

④ At the time "t13", the inverted delay signal S50 is risen to return into the initial state.

Namely, the high level width of the system clock signal CLK1 is larger than the delay time "td" of the delay circuit 50. The next cycle is executed after the inverted delay signal S50 was returned into high level in the last state of the previous cycle and the delay circuit 50 has re-set into the initial state.

Operations from the time "t20" to the time "t23" in FIG. 9 are operations of a B-system, wherein the high level width of the system clock signal CLK1 is shorter than the delay time "td". In this case, the high level width of the system clock signal CLK1 is narrow. After the system clock signal or the internal signal S10 has been risen at the time "t20" and the delay time "td" has passed, and then at the time "t21", the system clock signal CLK1 returns from the high level into the low level before the inverted delay signal S50 is fallen with the delay time "td" at the time "t22". With reference to FIG. 9, when at the time "t20", the internal signal S10 is risen from the low level into the high level, then the output sub-clock signal CLK2c is risen form the low level to the high level. After the delay time "td" has passed, at the time "t22", the inverted delay signal S50 is fallen from the high level into the low level.

Before the inverted delay signal S50 is fallen at the time "t22" and the internal signal S10 inputted into the delay circuit 50 reaches the output point of the delay circuit 50, at the time "t21" internal signal S10 is fallen from the high level into the low level, whereby one input of the AND gate 2 becomes low level. Thus, at the same time when the internal signal S10 is risen, the sub-clock signal CLK2c is fallen from the high level into the low level. At the time "t23" with the delay time "td" from the falling of the internal signal S10, the inverted delay signal S50 is risen from the low level to the high level thereby returning into the initial state.

In this B-system, the high level time periods of the system clock signal CLK1 and the inverted delay signal S50 are not overlapped to each other, wherein the sub-clock signal CLK2c is risen at the time "t20" in synchronizing with rising of the system clock signal CLK1. Notwithstanding, the sub-clock signal CLK2c is fallen at the time "t21" in synchronizing with the falling of the system clock signal CLK1 at the time "t21" prior to the timing of falling inverted delay signal S50 at the predetermined falling time t22. The sub-clock signal CLK2c has the normal rising time but has the shorter high level width than the, normal width "td", wherein the high level width varies depending upon the high level width of the system clock signal CLK1.

Operations from the time "t30" to the time "t35" in FIG. 9 are operations of a C-system, wherein the low level width of the system clock signal CLK1 is shorter than the delay time "td". In this case, the low level width of the system clock signal CLK1 is narrow. After the system clock signal has been fallen at the time "t30" and the delay time "td" has passed, and then at the time "t32", the system clock signal CLK1 is risen from the low level into the high level before the inverted delay signal S50 is risen with the delay time "td" at the time "t32". With reference to FIG. 9, in this system, in the end stage of the previous cycle, states of individual signals CLK1, S10, S50, CLK2c immediately before the system clock signal CLK1 is fallen from high level to low level at the time "t30" would be the same as states of the individual signals immediately before at the time "t12" in the A-system described above. Namely, the system clock signal CLK1 is high level, the inverted delay signal S50 is low level, the sub-clock signal CLK2c is low level. In this state, at first, in the final stage of the previous cycle, at the time "t30", the system clock signal CLK1 or the internal signal S10 is fallen from the high level to the low level, whereby one input of the AND-gate 2 becomes low level. At this time, as described above, the inverted delay signal S50 as another input to the AND-gate 2 has already been in the low level, for which reason the sub-clock signal CLK2c as AND-logic output from the AND-gate 2 remains low level. In response to transfer of the above internal signal S10 from the high level to the low level, the inverted delay signal S50 is risen from the low level to the high level at the time "t32" after the delay time "td".

On the other hand, before the inverted delay signal S50 is risen at the time "t32" or at a time "t31" before the internal signal S10 inputted into the delay circuit 50 reaches an output point of the delay circuit 50, the internal signal S10 once fallen to the low level is again risen to the high level. Notwithstanding, at this time "t31", the inverted delay signal S50 as the one input to the AND-gate 2 still remains low level, for which reason the sub-clock signal CLK2c as the AND logic output from the AND-gate 2 is maintained at the low level. Thereafter, the inverted delay signal S50 is transferred to the high level. at the time "t32", whereby two inputs to the AND-gate 2 become high level. The sub-clock signal CLK2c from the AND-gate 2 is risen from the low level to the high level in synchronizing with the transfer of the inverted delay signal S50 to the high level. Thereafter, at the time "t33" later by the delay time "td" from when the internal signal S10 is risen at the time "t31", the inverted delay signal SS0 is fallen from the high level to the low level. In synchronizing with the transfer in level of the inverted delay signal S50, the output sub-clock signal CLK2c is also fallen from the high level to the low level, returning to the original state.

In this C-system, at first, the system clock signal CLK1 is fallen (at the time "t30") and then risen (at the time "t31"), and subsequently the inverted delay signal S50 is risen (at the time "t32") and then fallen (at the time "t33"). Namely, the two signals CLK1 and S50 are shifted and not overlapped. The generated sub-clock signal CLK2c is normally fallen at the time "t33" or at the fall-timing of the inverted delay signal S50, but is rapidly risen at the later time "t32" than the time "t31" of rising the system clock signal CLK1 in response to the rise of the inverted delay signal S50. As a result, the obtained output sub-clock signal CLK2c is risen with a delay from the normal timing and a high level width is shorter than a predetermined width "td" and further the high level width varies depending upon the high level width of the system lock signal CLK1.

SUMMARY OF THE INVENTION

As described above, the conventional clock generator circuit shown in FIG. 8 is that if the high level width or the low level width of the input system lock signal CLK1 is shorter than the delay time "td" by the delay signal 50, then there is generated the sub-clock signal CLK2c with the narrower high level width and with rising and falling times different from predetermined timings. This is not responsible to various system clock signals.

An object of the present invention is to provide a highly generalized clock signal generator circuit for generating a sub-clock signal which is constant in signal width in synchronizing with rising of a main clock signal externally given by use of both the externally given main clock signal and an inverted delay signal to the main clock signal, wherein the clock signal generator circuit is capable of generating the sub-clock signal which is risen with a predetermined width at a predetermined timing even when a high level width or a low level width of the externally given main clock signal is shorter than an inverted delay time.

A clock signal generator circuit in accordance with the present invention is provided with an inverting delaying means for inverting and delaying a main clock signal externally given to generate an AND logic signal of said main clock signal and an inverted delay signal thereof, for generating a sub-clock signal which transfers from a first level to a second level in synchronizing with a transfer of said main clock signal from said first level to said second level and also transfers from said second level to said first level in synchronizing with another transfer of said main clock signal from said second level to said first level, and is characterized in that a holding means is provided for holding said main clock signal, after transferred from said first level, at said second level for at least a time more than a delay time by said inverted delay means.

The inverting and delaying means is provided with a reset means for transferring said main clock signal from said second level to said first level or transferring said inverted delay signal outputted from said inverting delaying means from said second level to said first level for compulsory returning to an initial state for a shorter time than a delay time by said inverting delaying means.

Figure 1:
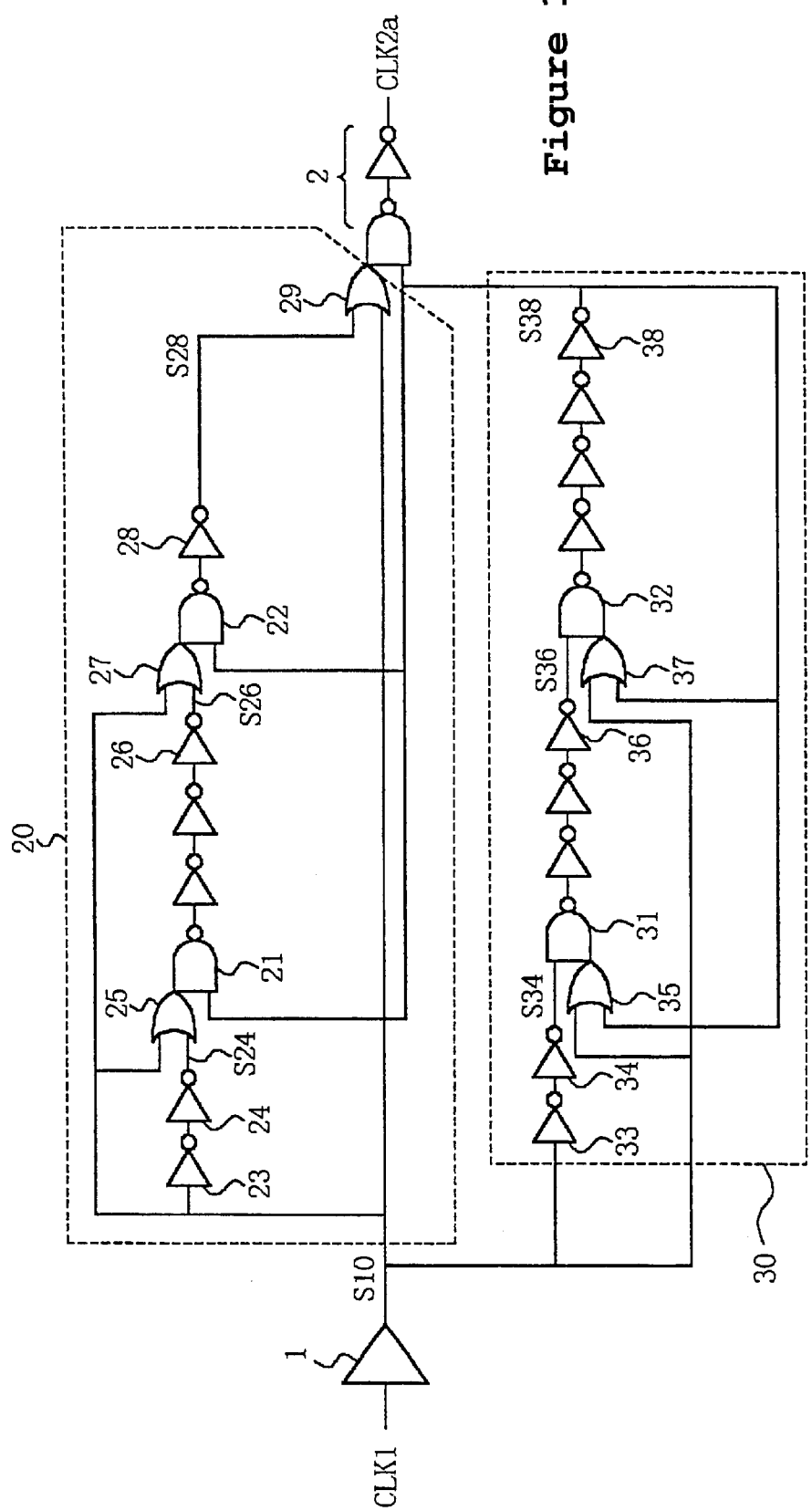
FIG. 1 is a circuit diagram illustrative of a first clock signal generator circuit in a first embodiment in accordance with the present invention.

In the drawings, elements are identified as follows:

1: receiver circuit

2: AND gate 3, 4, 23, 24, 26, 28, 33, 34, 36, and 38: inverter 20, 21: holding circuit 30: delay circuit 40: latch circuit 50: delay circuit.

Both said holding means and said inverting delaying means are provided and said holding means is further provided with means for reset by an output signal from said inverting delaying means.

DESCRIPTION OF THE PREFERRED EMBODIMENTS

With reference to FIG. 1, a clock signal generator circuit shown in this drawing is provided with a delay circuit 30 and a holding circuit 20. The delay circuit 30 is provided with an eleven-stage gate chain started by an inverter 33 and terminated with an inverter 38. The gate chain serves as an inverted delay chain with a delay time "tdD". The delay time "tdD" decides a high level width of a generated sub-clock signal CLK2a. The gate chain includes, at its intermediate position, two complex gates, for example, a complex gate which comprises an two-input NAND-gate 31 and a two-input OR-gate 35 on its previous stage and another complex gate which comprises an two-input NAND-gate 32 and a two-input OR-gate 37 on its previous stage.

Those complex gates operate as follows. When on an end stage of a previous cycle, a system clock signal CLK1 or an internal signal S10 returns from a high level to a low level, for preparation to the next cycle, an inverted delay signal S38 as an output from the delay circuit 30 is risen rapidly within a shorter time than the delay time "tdD" of the eleven staged gate chain and signals S34 and S36 in the gate chain are fallen rapidly, so that the delay circuit 30 is initialized into such a state that the system clock signal CLK1 is in low level (the delay circuit 30 is reset). These reset complex gates allow that even if a low level width of an externally given system clock signal CLK1 is shorter than the delay time "tdD" of the gate chain, then the delay circuit 30 is already reset before a next cycle is started (before the system clock signal CLK1 returned from the high level to the low level in a later half of the previous cycle is risen from the low level to the high level.

As can be seen from circuit operations to be described below, it is possible that the output signal 38 from the delay circuit 30 is different in pulse width from an inverted delay signal of the internal signal S10, and would not exactly be just the inverted delay signal of the internal signal S10. In view of clearly describing a comparison with the conventional clock signal generator circuit, the output signal S38 from the delay circuit 30 will hereinafter be referred to be an inverted delay signal.

The holding circuit 20 is provided with an eight-stage gate chain started with an inverter 23 and terminated with an inverter 28. This gate chain serves as a non-inverted delay chain with a delay time "tdH". This gate chain includes, at its intermediate position, two complex gates, for example, a complex gate which comprises a two-input NAND 21 and a two-input OR-gate 25 on its previous stage and another complex gate which comprises a two-input NAND 22 and a two-input OR-gate 27 on its previous stage. Those complex gates rapidly rise the output signal S28 from the final stage of the gate chain to the high level upon rising the system clock signal CLK1 from the low level to the high level at an initial of the cycle, and further hold the risen signal S28 in the high level for a time more than the delay time "tdD" of the delay circuit. Even if the high level width of the system clock signal CLK1 is shorter than the delay time "tdD" by the delay circuit 30, a high level width of the generated sub-clock signal CLK2a is extended to the delay time "tdD" of the delay circuit and becomes a predetermined high level width. The complex gate in the gate chain further falls rapidly the output signal S28 from the gate chain final stage from the high level to the low level in response to falling the inverted delay signal S38 from the high level to the low level in a later half of the cycle before the inverted delay signal S38 is returned to the high level for the next cycle. If, contrary to this, the signal S28 of the holding circuit were remaining in the high level, the output inverted delay signal S38 in the delay circuit is reset for the next cycle whereby the sub-clock signal CLK2a is risen immediately as a malfunction without waiting for rising the inputted system clock signal CLK1 from the low level to the high level.

Figure 2:
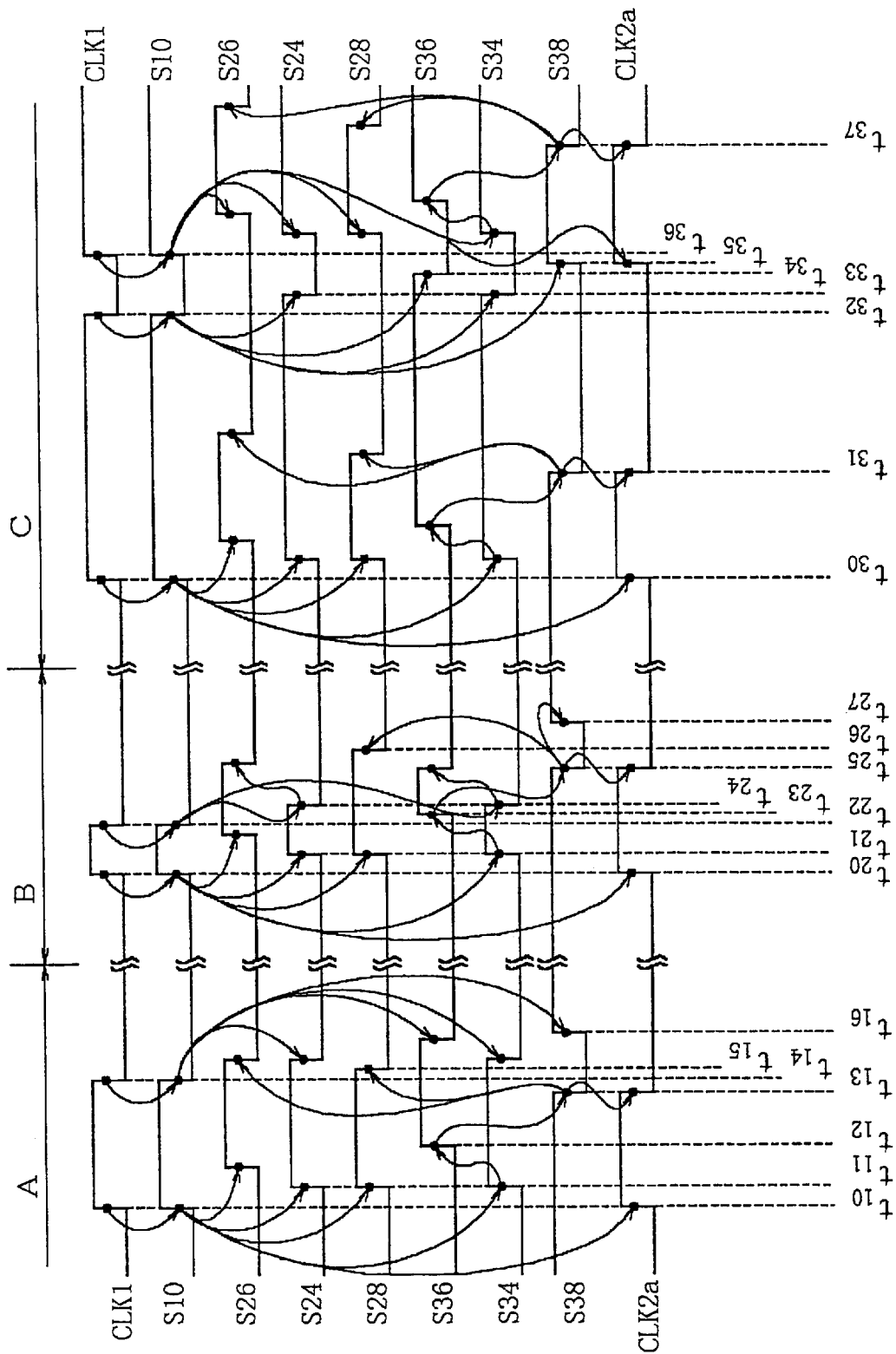
FIG. 2 is a timing chart of the clock signal generator circuit of FIG. 1.

Operations of this clock signal generator will be described for every cases where a high level width and a low level width of the system clock signal are long, and where the high level width of the system clock signal is narrow, and where the low level width of the system clock signal is narrow. At first, operations of this clock signal generator will be described in case of application to an A-system where a high level width and a low level width of the system clock signal are longer than the delay time "tdD" by the delay circuit 30. With reference to FIG. 2, in an initial state of the circuit (in the state prior to a time "t10", the system clock signal CLK1 is low level, the output signal S38 from the delay circuit 30 is high level and a gate chain output signal S28 in the holding circuit 20 is low level. In these states, at the time "t10", the system clock signal CLK1 or the internal signal S10 is risen from the low level to the high level. Of the two-input OR-gate 29 on the final stage of the holding circuit 20, the signal S10 as one input thereto becomes high level, whereby the output therefrom is thus made into the high level immediately. An input into the AND-gate 2 on the following state becomes high level. At this time, the inverted delay signal S38 from the delay circuit to be inputted into another input of the AND-gate 2 still remains high level. Accordingly, the two inputs to the AND-gate 2 are high level. As a result, the sub-clock signal CLK2a as the AND-logic output from the AND gate 2 is risen from the low level to the high level at the same time when at the time "t10" the system clock signal CLK1 is risen to the high level.

On the other hand, in the holding circuit 20, the inverted delay signal S38 from the delay circuit and to be inputted into one input of each of the NAND-gates 21 and 22 which constitute the complex gate are high level. In this state, at the time "t10", the internal signal S10 is risen from the low level to the high level. At this time, one input of each of the OR-gates 25 and 26 which constitute the complex gate becomes high level, whereby a high level output is outputted. As a result, the signal S24 in the gate chain is risen from the low level to the high level at a time "t11" which is delayed from the time "t10" with a time corresponding to two stages of the input point of the inverter 23 to the output point of the inverter 24. The signal S26 is risen to the high level with a delay of a time corresponding to four stages of the input point of the NAND gate 21 to the output point of the inverter 26. An output signal S28 from the final stage of the gate chain is risen to the high level with a delay of a time corresponding to two stages of the input point of the NAND gate 22 to the output point of the inverter 28.

In the delay circuit 30, the output inverted delay signal S38 is high level. Thus, each of the two-input OR-gates 35 and 37 receiving one inputs of this high level signal S38 outputs a high level signal. Accordingly, the gate chain of the inverters 33–38 serves as an inverted delay chain.

At the time "t10", the internal signal S10 is risen to the high level. The signal S34 is risen from the low level to the high level at a time "t11" which is delayed with a time corresponding to two stages of the input point of the inverter 33 to the output point of the inverter 34. In response to the transfer to the high level of this signal S34, the signal S36 is risen from the low level to the high level at a time "t12" which is delayed with a time corresponding to four stages of the input point of the NAND gate 31 to the output point of the inverter 36. In response to the transfer to the high level of this signal S36, the inverted delay signal S38 is fallen to the low level at a time "t12" which is delayed with a time corresponding to four stages of the input point of the NAND gate 31 to the output point of the inverter 36.

At the time "t13", the output inverted delay signal S38 from the delay circuit is fallen to the low level, one input of each of the two-input AND-gates 21 and 22 which constitute the reset complex gate in the holding circuit 20 becomes low level. As a result, the output signal S26 from the inverter 26 is fallen to the low level with a delay in time corresponding to four stages of the input point of the NAND gate 21 to the output point of the inverter 26 from the time "13". The output signal S28 from the inverter 28 is fallen to the low level with a delay in time corresponding to two stages of the input point of the NAND gate 22 to the output point of the inverter 28 from the time "t13".

At a time "t14" after the time "t13" when the inverted delay signal S38 is fallen from the high level to the low level, the system clock signal CLK1 or the internal signal S10 is fallen from the high level to the low level. At this time, the inverted delay signal S38 of the delay circuit has already been fallen to the low level. Two inputs of each of the two-input OR-gates 35 and 37 which constitute the reset complex gate in the delay circuit become low level. Outputs from the two-input NAND gates 31 and 32 of the complex gate are transferred to the low level at the same time when the internal signal S10 is fallen. As a result, the signal S34 in the gate chain is fallen to the low level with a delay in time corresponding to two stages of the input point of the inverter 33 to the output point of the inverter 34 from the transfer of the internal signal S10 to the low level at the time "t14". The signal S36 in the gate chain is fallen to the low level with a delay in time corresponding to four stages of the input point of the NAND gate 34 to the output point of the inverter 36 from the time "t15". The output inverted delay signal S38 from the delay circuit is fallen to the low level at a time "t16" with a delay in time corresponding to five stages of the input point of the NAND gate 32 to the output point of the inverter 38 from the time "15", whereby the delay circuit 30 is reset.

As a result of the sequential operations described above, there is generated a sub-clock signal CLK2a which is risen in synchronizing with the rising of the externally given system clock signal CLK1 at the time "t10" and fallen with falling the inverted delay signal S38 from the delay circuit at the time "t16", wherein a high level width thereof is identical with the delay time "tdD" by the eleven stage gate chain comprising the input point of the inverter 33 to the output point of the inverter 38 in the delay circuit 30.

Operations of this clock signal generator will be described in case of application to a B-system where a high level width is shorter than the delay time "tdD" by the delay circuit 30. With reference to FIG. 2, in an initial state of the circuit (in the state prior to a time "t20"), the system clock signal CLK1 is low level, the output signal S38 from the delay circuit 30 is high level and a gate chain output signal S28 in the holding circuit 20 is low level. In these states, at the time "t20", the system clock signal CLK1 or the internal signal S10 is risen from the low level to the high level. As similarly to the A-system, the sub-clock signal CLK2a is risen from the low level to the high level at the same time when internal signal S20 is risen to the high level.

In the holding circuit 20, similarly to the A-system, the signal S24 in the gate chain is risen from the low level to the high level at a time "t21" which is delayed from the time "t20" with a time corresponding to two stages of the input point of the inverter 23 to the output point of the inverter 24. The signal S26 is risen to the high level with a delay of a time corresponding to four stages of the input point of the NAND gate 21 to the output point of the inverter 26. An output signal S28 from the final stage of the gate chain is risen to the high level with a delay of a time corresponding to two stages of the input point of the NAND gate 22 to the output point of the inverter 28.

On the other hand, in the delay circuit 30, similarly to the A-system, the signal S34 is risen from the low level to the high level at a time "t21" which is delayed with a time corresponding to two stages of the input point of the inverter 33 to the output point of the inverter 34. Subsequently, the signal S36 is risen from the low level to the high level at a time "t23" which is delayed with a time corresponding to four stages of the input point of the NAND gate 35 to the output point of the inverter 36 from the time "t21". The inverted delay signal S38 is fallen from the high level to the low level at a time "t25" which is delayed with a time corresponding to five stages of the input point of the NAN)

gate 32 to the output point of the inverter 38 from the time "t23". As described below, when the inverted delay signal S38 is fallen from the high level to the low level at the time "t25", the internal signal S10 has already been fallen to the low level. Two inputs of the two-input OR-gate 37 of the reset complex gate become low level and output becomes low level. As a result, the output inverted delay signal S38 from the delay circuit is returned again to the high level at a time "t27" with a delay in time corresponding to five stages of the input point of the NAND gate 32 to the output point of the inverter 38 from the time "t25", whereby the delay circuit 30 is reset. In the holding circuit 20, at this time, the output signal S28 from the final stage of the gate chain is fallen from the high level to the low level at the time "t26" With a delay in time corresponding to the two stages of the input point of the NAND gate 22 to the output point of the inverter 28. In response to falling the inverted delay signal S38 to the low level at the time t25.

The output signal S28 from the final stage of the gate chain in the holding circuit is fallen from the high level to the high level at the time "t26" delayed with a time corresponding to the two stages from the time "t25", but is risen from the low level to the high level at the time "t27" delayed with a time corresponding to five stages from the time "t25". Accordingly, at the time "t27" when the inverted delay signal S38 from the delay circuit is returned to the high level for the next cycle, the output signal S28 from the final stage of the gate chain in the holding circuit has already been reset at the prior time "t26", and the output from the OR-gate 29 has already been in the low level. Thus, even at the time "t27", the inverted delay signal S38 is reset at high level, the outputted sub-clock signal CLK2a remains low level and no malfunction to rise the same to the high level appears.

Subsequently, the system clock signal CLK1 or the internal signal S10 is fallen from the high level to the low level at a time "t22" before the inverted delay signal S38 is changed to the low level at the time "t25" or before the change of the internal signal S10 from the low level to the high level reaches from the input point of the inverter 33 on the initial stage of the delay circuit to the final stage of the gate chain, provided that as described below, it is necessary that the high level width of the system clock signal CLK1 during the time "t20" to the time "t22" is not less than a time corresponding to four stages from the input point of the NAND gate 21 of the gate chain to the output point of the inverter 26. Under these conditions, the internal signal S10 is changed to the low level at the time "t22". At this time, the outputted inverted delay signal S38 from the delay circuit is high level. Thus, the gate chain in the holding circuit 20 serves as a delay chain upon falling the internal signal S10 to the low level. As a result, the signal S24 in the gate chain is fallen from the high level to the low level at the time "t24" delayed with a time corresponding to two stages from the input point of the inverter 23 to the output point of the inverter 24. Subsequently, the signal S26 is changed from the high level to the low level at a time delayed from the time "t24" with a time corresponding to four stages of the input point of the NAND gate 21 to the inverter 26. The output signal S28 from the final stage of the gate chain remains further held at the high level for a further time corresponding to the two stages of the input point of the NAND gate 22 to the output point of the inverter 28. However, prior to them, the inverted delay signal S38 has been fallen from the high level to the low level. In response to this rising, this is fallen to the low level at the time "t26" delayed with a time corresponding to the two stages of the input point of the NAND gate 22 to the output point of the inverter 28 from the time "t25". In any event, the output signal S28 from the final stage of the gate chain in the holding circuit is kept at the high level during when the inverted delay signal S38 from the delay circuit remains high level. Accordingly, the internal signal S10 as one input to the OR gate 29 on the final stage in the holding circuit 20 has already been fallen but the output signal S28 from the gate chain and to be inputted as another input thereto still remains high level. For this reason, the high level signal output is continued during when the inverted delay signal S38 remains high level. As a result, during when the inverted delay signal S38 as one input to the AND gate 2 remains high levels the output from the OR gate 29 and to be inputted as another input remains high level. The sub-clock signal CLK2a as an output from the AND gate is fallen at a timing of falling the inverted delay signal S38.

As a result of the sequential operations described above, there is generated a sub-clock signal CLY2a which is risen in synchronizing with the rising of the externally given system clock signal CLK1, wherein a high level width thereof is identical with the delay time "tdD" by the delay circuit 30 even if the high level width of the system clock signal CLK1 is shorter than the delay time "tdD".

In case of operations of the B-system, at the time "t20" the system clock signal CLK1 is risen to the high level. The signal S26 in the gate chain is then risen to the high level with a delay in tome corresponding to four stages of the input point of the NAND gate 21 to the output point of the inverter 26, whereby one input to the OR gate 27 in the complex gate becomes high level. Accordingly, after the system clock signal CLK1 has been fallen to the low level, the signal S28 from the final stage of the gate chain is kept at the high level. Thus, the high level of the signal S28 from the final stage of the gate chain is kept for a time which corresponds to eight stages in total of two stages of the input point of the inverter 23 to the output point of the inverter 24, the four stages of the input point of the NAND gate 21 to the output point of the inverter 26 and two stages of the input point of the NAND gate 22 to the output point of the inverter 28, after at the time "t22" the system lock signal CLK1 is fallen to the low level so that the gate chain serves as a delay chain. Namely, this is kept in the high level during a time corresponding to twelve stages with a further addition of at least the high level width of the system clock signal CLK1 corresponding to four stages from the time "t20". Actually, however, in response to falling the inverted delay signal S38 from the delay circuit from the high level to the low level at the time "t25" with a delay time "tdD" corresponding to eleven stages from the time "t20", this is fallen to the low level at the time "t26" delayed with a time corresponding to two stages of the input point of the NAND gate 22 to the output point of the inverter 28 from the time "25" because as described above, the output signal S28 from the final stage of the gate chain in the holding circuit, which is to be inputted to the one input from the AND gate 2 has pervasively been fallen to the low level before the time "t27" when the inverted delay signal S38 from the delay circuit is risen again to the high level.

In the clock signal generator in this embodiment, the gate chain provided in the holding circuit 20 extends the high level width of the risen output signal S28 from the final stage of the gate chain to a time not less than the inverted delay time "tdD" of the delay circuit 30. It is necessary that the high level width of the system clock signal CLK1 is at least four stage. The signal S28 is kept in high level for a time corresponding to two stages after the inverted delay signal S38 is fallen to the low level.

The NAND gate 32 provided in the gate chain of the delay circuit rises again the inverted delay signal S38, once fallen from the high level to the low level at the time "t25", with a delay time corresponding to the five stages from the input point of the NAND gate 32 to the output point of the inverter 38 (the time "t27"), whereby the reset to the inverted delay signal S38 which originally needs the time corresponding to the eleven stages is accelerated to a time corresponding to five stages.

The NAND gate 22 provided in the gate chain in the holding circuit prevents any malfunction, wherein when the inverted delay signal S38 is fallen from the high level to the low level (the time "t25"), the output signal S28 from the final stage of the gate chain in the holding circuit has already been fallen before the inverted delay signal S38 is again risen to the high level for the next cycle (the time "t27").

Operations of this clock signal generator will be described in case of application to a C-system where a low level width is shorter than the delay time "tdD" by the delay circuit 30. With reference to FIG. 2, in an initial state of the circuit (in the state prior to a time "t30"), the system clock signal CLK1 is low level, the output signal S38 from the delay circuit 30 is high level and a gate chain output signal S28 in the holding circuit 20 is low level. In these states, at the time "t30", the system clock signal CLK1 or the internal signal S10 is risen from the low level to the high level. As similarly to the A-system, the sub-clock signal CLK2a is risen from the low level to the high level at the same time when internal signal S20 is risen. Similarly to the A-system, the sub-clock signal CLK2a is fallen to the low level at the time "t31" delayed with a time corresponding to eleven stages by the delay circuit in response to falling the inverted delay signal S38 from the high level to the low level, whereby the sub-clock signal CLK2a with the predetermined high level width is outputted. Upon transfer of the inverted delay signal S38 to the low level, the NAND gates 21 and 22 in the holding circuit output low level. The signal S26 in the gate chain is fallen to the low level at a time delayed with a time corresponding to four stages of the input point of the NAND gate 21 to the output point of the inverter 26 from the time "t31". The signal S28 is fallen to the low level at a time delayed with a time corresponding to two stages of the input point of the NAND gate 22 to the output point of the inverter 28.

On the other hand, the internal signal S10 remains high level after the time "t31". The signals S34 and S36 in the gate chain in the delay circuit are held at the high level whilst the inverted delay signal S38 is kept in the low level. The signal S24 in the holding circuit is also kept at the high level.

In this state, at the time "t32", the system lock signal CLK1 or the internal signal S10 is fallen from the high level to the low level. The signal S24 in the holding circuit is fallen to the low level at the time "t32" delayed with a time corresponding to the two stages of the input point of the inverter 23 to the output point of the inverter 24. The signal S34 in the delay circuit is also fallen to the low level at the time "t32" delayed with a time corresponding to the two stages of the input point of the inverter 33 to the output point of the inverter 34. On the other hand, in each of the complex gates in the delay circuit, two inputs to each of the OR gates 35 and 37 become low level. Thus, the signal S36 in the gate chain is fallen to the low level at the time "t34" delayed with a time corresponding to the four stages of the input point of the NAND gate 31 to the output point of the inverter 36. The inverted delay signal S38 is inverted at a time "t35" delayed with a time corresponding to the five stages of the input point of the NAND gate 32 to the output point of the inverter 38, whereby the holding circuit 20 and the delay circuit return to the initial states until the time "t35".

Thereafter, at a time "t36", the system clock signal CLK1 or the internal signal S10 is risen from the low level to the high level. The sub-lock signal CLK2a is risen to the high level in synchronizing with rising of the system clock signal CLK1 through the same operation as when the system clock signal CLK1 is risen at the time "t30", and further is fallen from the high level to the low level at a time "t37" delayed with a time corresponding to eleven stages in the delay circuit. The sub-clock signal CLK2a is outputted which is risen in synchronizing with rising the system clock signal CLK1 and has a high level width corresponding to the eleven stages.

In this embodiment, during from falling the system clock signal to the low level at the time "t32" to rising the same to the high level at the time "t36", the signal S36 in the delay circuit is transferred to the low level, the inverted delay signal S38 is transferred to the high level and the signal S24 in the holding circuit 20 is transferred to the low level, in order to reset the delay circuit 30 and the holding circuit 20. The necessary time for the reset corresponds to five stages from the time "t32" to the time "t35" or corresponds to a time period after the internal signal S10 is changed to the low level through the five stages of the input point of the NAND gate 32 of the complex gate to the output point of the inverter 38 until the inverted delay signal S38 from the gate chain is changed to the high level.

In the clock signal generator circuit in the embodiment, an arithmetic operation in AND-logic is carried out of the internal signal S10 and the inverted delay signal S38 in the reset complex gate provided in the gate chain n the delay circuit so as to shorten the reset time to the delay circuit originally needing the time corresponding to the eleven stages to the delay time corresponding to the five stages from the input point of the NAND gate 32 to the output point of the inverter 38. Even if the low level width of the system clock signal CLK1 is short, the sub-clock signal CLK2a can be generated which is risen in synchronizing with rising the system lock signal and has a high level width corresponding to the delay time "tdD" in the delay circuit.

In the above descriptions, an example is taken that both the holding circuit 20 and the delay circuit 38 are provided. Notwithstanding, the present invention should not be limited to this. As shown in examples described below, if any one of the holding circuit 20 and the delay circuit 38 is provided, it is possible to improve responsibility to the various systems as compared to the conventional clock signal generator circuit.

Figure 3:
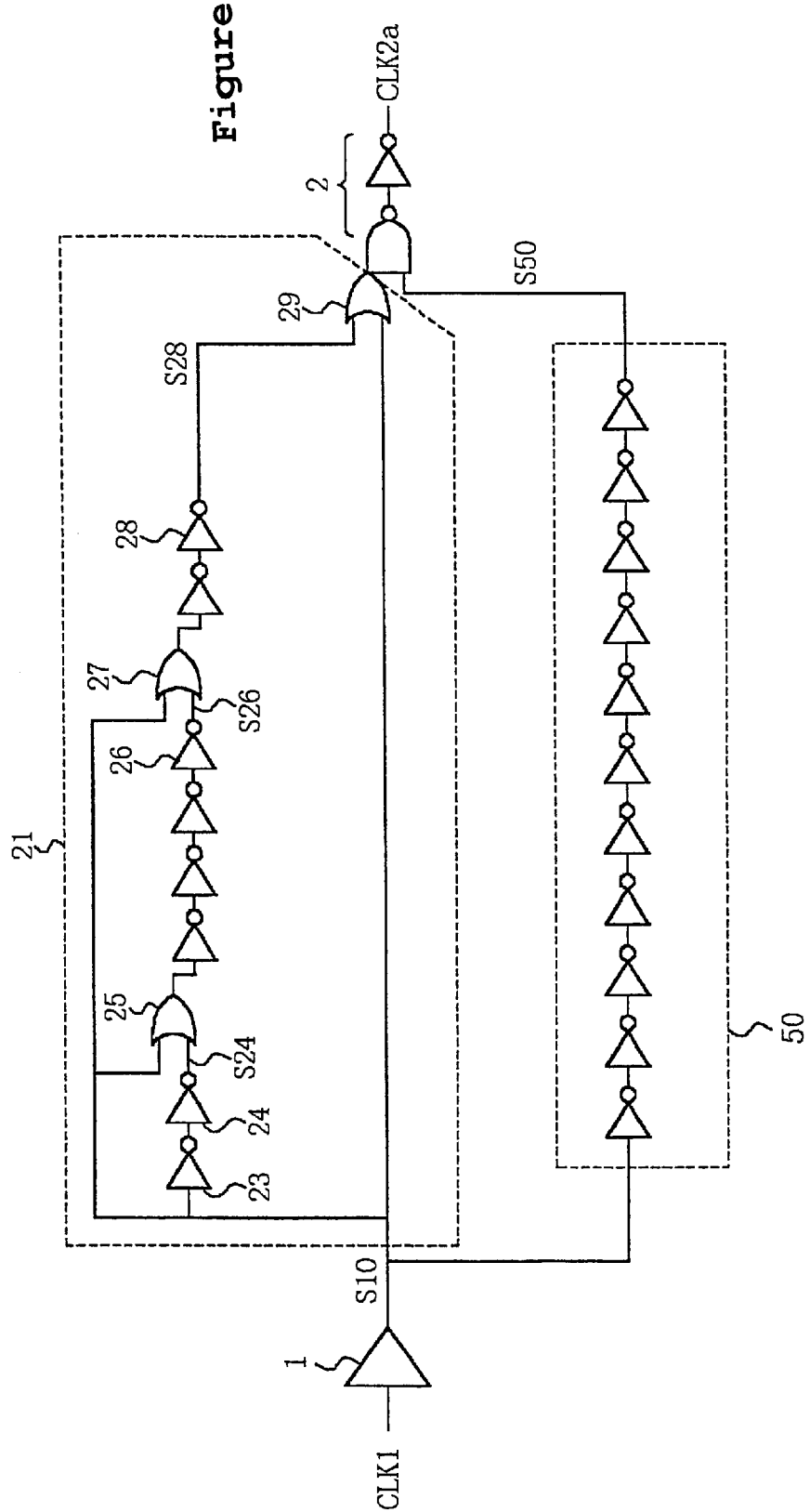
FIG. 3 is a circuit diagram illustrative of a second clock signal generator circuit in a first embodiment in accordance with the present invention.
Figure 4:
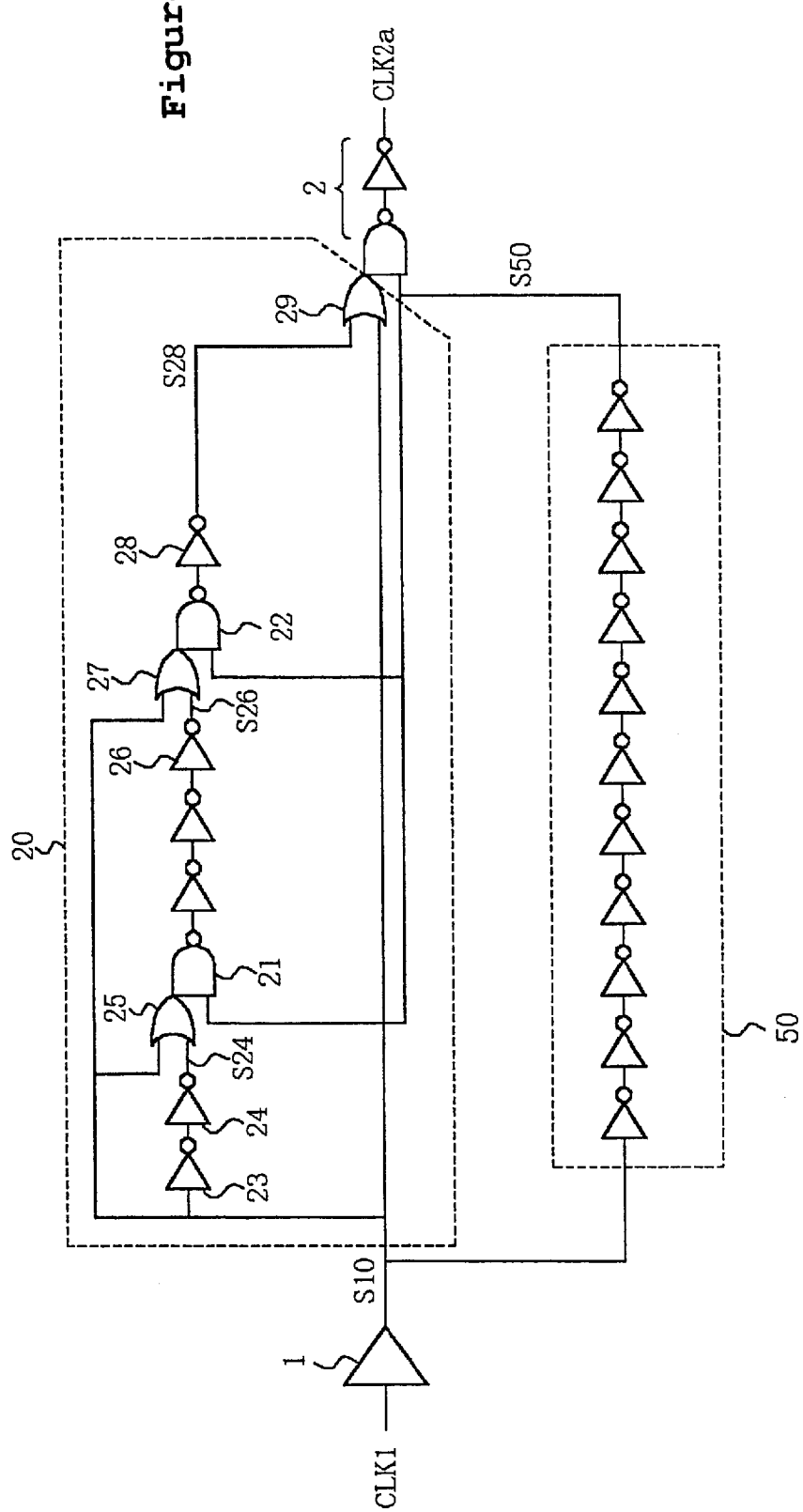
FIG. 4 is a circuit diagram illustrative of a third clock signal generator circuit in a first embodiment in accordance with the present invention.

FIG. 3 shows a circuit diagram of a clock signal generator circuit provided with only a holding circuit 21. In this case, if the high level width of the system clock signal CLK1 is not less than a time corresponding to four stages of the output point of the AND gate 25 to the output point of the inverter 26, it is possible that the high level of the output signal S28 from the final stage of the gate chain is extended to a time corresponding to eight stages as a sum of the high level width "W" of the system clock signal and the delay time of the gate chain so as to be not less than a delay time corresponding to one stage of the delay circuit 50. Accordingly, the timing of falling the generated sub-clock signal CLK2a corresponds to the timing of falling the output inverted delay signal S50 from the delay circuit 50 from the high level to the low level and predetermined pulse width can be obtained. Further, when the system clock signal is fallen to the low level, the signal S28 in the holding circuit 21 I fallen from the high level to the low level with a time delay corresponding to eight stages from when the system clock signal is fallen. By contrast, the output inverted delay time S50 of the delay circuit is risen to the high level with a delay time corresponding to eleven stages. Namely, the holding circuit 21 has already been reset prior to the reset to the delay circuit 50, for which reason no malfunction appears where the sub-clock signal is again risen to the high level by the reset to the delay circuit. In the above example shown in FIG. 3, the holding circuit 21 is not provided with a reset means for forcibly resetting the same by the inverted delay signal S50. As in an example shown in FIG. 4, the holding circuit 20 is provided with reset NAND gates 21 and 2 for forcibly resetting the same by the inverted delay signal S50, so as to surely prevent the malfunction. In accordance with the dock signal generator circuits shown in FIG. 3 or 4, in addition to the A-system, it is possible to respond to the B-system where the high level width of the system clock signal CLK1 is narrow. The responsibility to the various systems is higher than the conventional clock signal generator circuit responsible to the A-system only.

Figure 5:
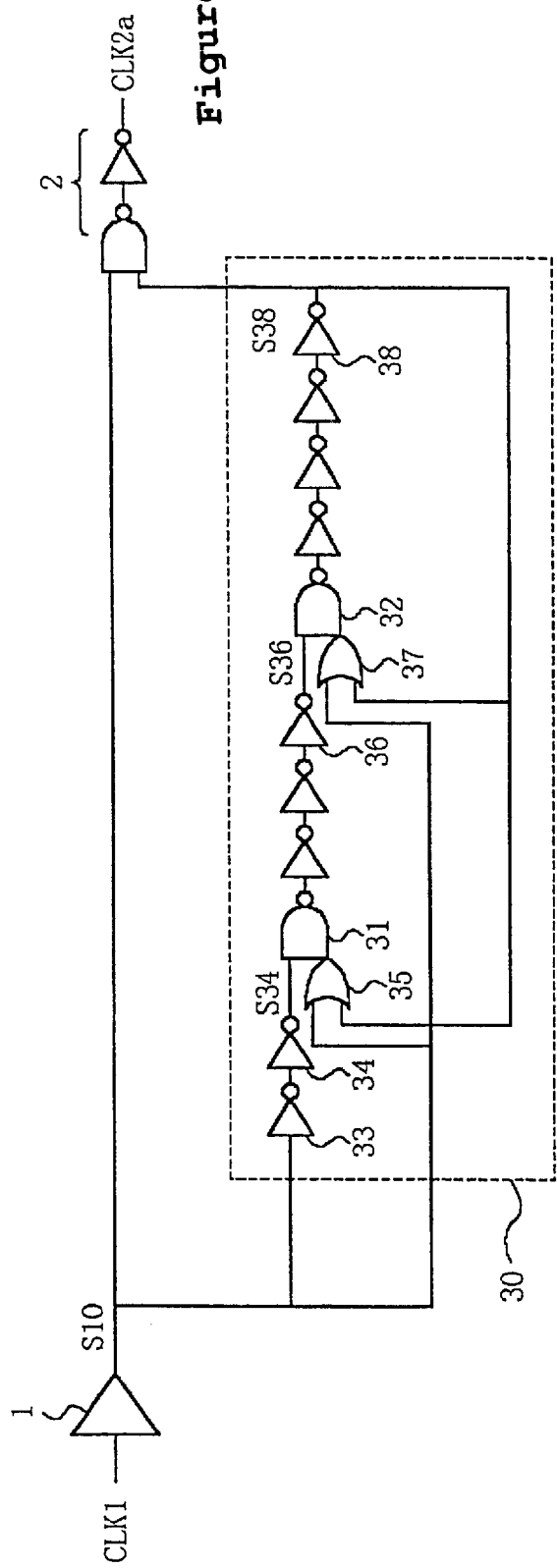
FIG. 5 is a circuit diagram illustrative of a fourth clock signal generator circuit in a first embodiment in accordance with the present invention.

On the other hand, FIG. 5 shows an example circuit where the conventional clock signal generator circuit is modified with the delay circuit 30 shown in FIG. 1. In this example, as described above, it is possible to shorten the reset time originally needing the time corresponding to the eleven stage to a time corresponding to five stages. In addition to the A-system, it is possible to respond to the C-system where the low level of the system clock signal is narrow. Accordingly, the responsibility to the various systems is higher than the conventional clock signal generator circuit responsible to the A-system only.

Figure 6:
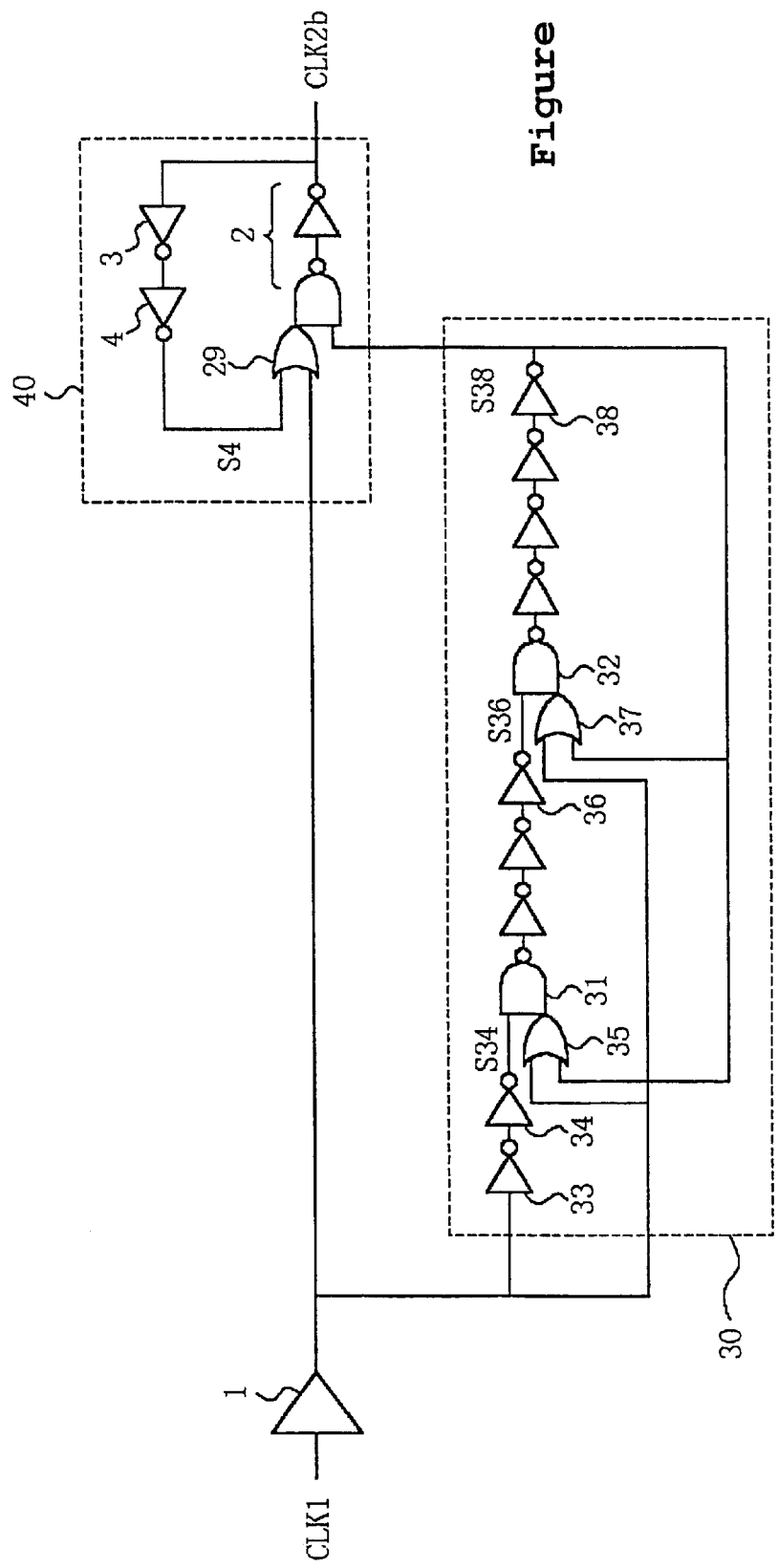
FIG. 6 is a circuit diagram illustrative of a clock signal generator circuit in a second embodiment in accordance with the present invention.
Figure 7:
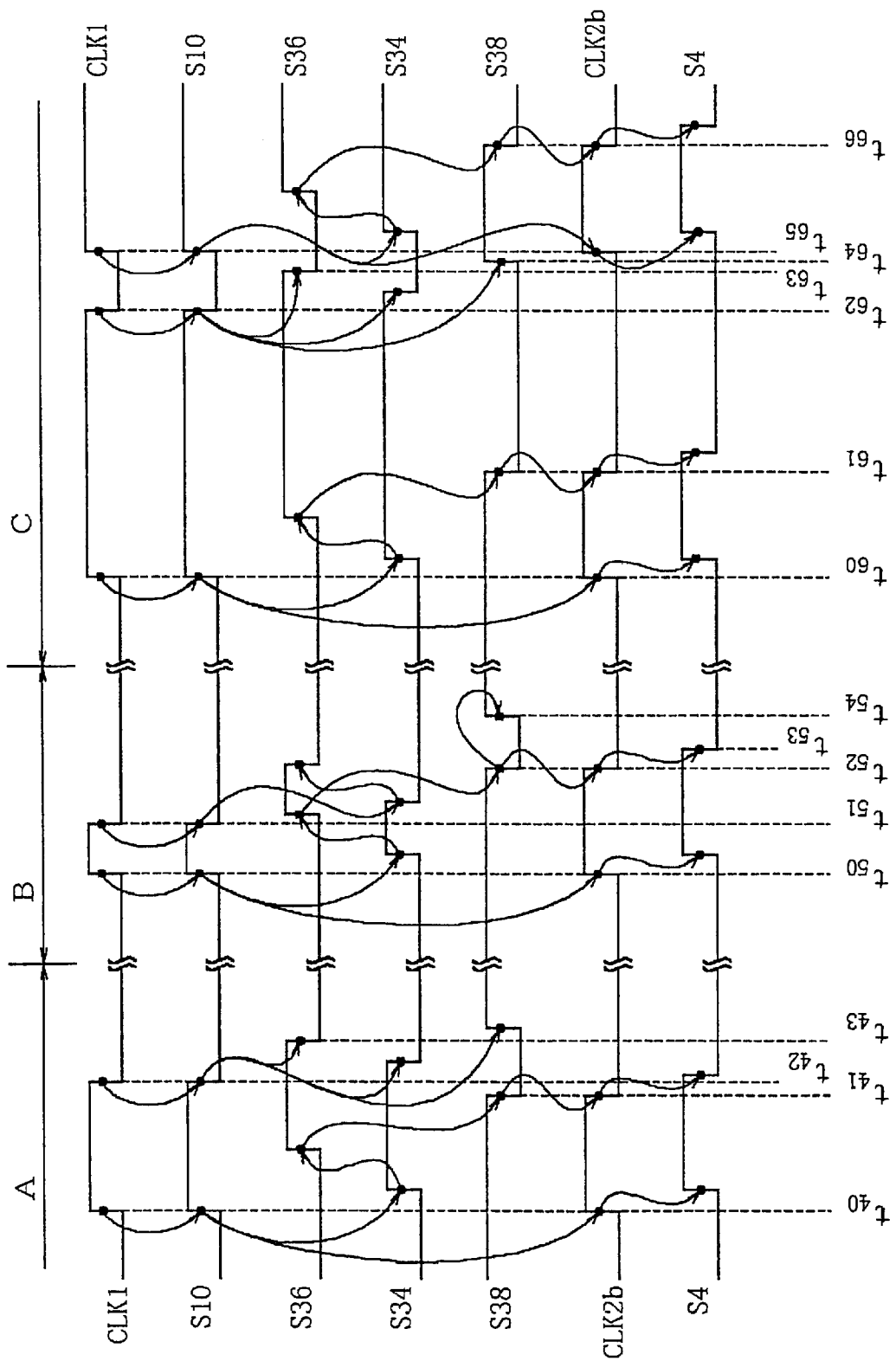
FIG. 7 is a timing chart of the clock signal generator circuit of FIG. 6.

A clock signal generator circuit in a second embodiment in accordance with the present invention will be described. FIG. 6 is a circuit diagram illustrative of a clock signal generator circuit in the second embodiment. FIG. 7 is a timing chart in operation. With reference to FIG. 6, the clock signal generator circuit is provided with a latch circuit 40 in spite of the holding circuit 20, in view of which, this embodiment is different from the first embodiment. The latch circuit 40 feeds an output from the AND gate 2 on the output stage or the generated sub-clock signal CLK2b back through a two-staged series connection of the inverters 3 and 4 to one input of the OR gate 29.

Operations of the clock signal generator circuit will hereafter be described with reference to FIG. 7 which is a timing chart. Operations, as the clock signal generator circuit is applied to the A-system, will first be described. With reference to FIG. 7, in an initial state of the circuit (in the state prior to a time "t40", the system clock signal CLK1 is low level, the internal signal S10 is low level, the signals S34 and S36 are low level, the inverted delay signal S38 is high level, the sub-clock signal CLK2b is low level, the signal S4 in the latch circuit 40 is low level. In these states, at the time "t40", the system clock signal CLK1 or the internal signal S10 is risen from the low level to the high level. Of the two-input OR-gate 29 on the final stage of the latch circuit, one input becomes high level, whereby the OR logic as an output from the OR-gate 29 is thus made into the high level. At this time, the inverted delay signal S38 from the delay circuit to be inputted into another input of the AND-gate 2 still remains high level. Accordingly, the subclock signal CLK2a as the output from the AND gate 2 is risen to the high level. Subsequently, another input to the OR gate 29 in the latch circuit 40 is risen to the high level with a time delay corresponding to two stages of the input point of the inverter 3 to the output point of the inverter 4 after the transfer of the sub-clock signal CLK2a to the high level. The sub-clock signal CLK2a is latched at high level during when the inverted delay signal S38 from the delay circuit remains high level independently from the level of the internal signal S10 as another input to the OR gate 29.

Thereafter, at a time "t41" delayed with a delay time "tdD" corresponding to eleven stages of the delay circuit, the internal signal S10 inputted into the gate chain of the delay circuit reaches to the output point of the inverter 38 on the final stage of the gate chain, whereby the inverted delay signal S38 is fallen from the high level to the low level. The latch circuit 40 is thus reset and the sub-clock signal CLK2b is fallen to the low level.

Further, thereafter, at a time "t42", the system lock signal CLK1 or the internal signal S10 is fallen from the high level to the low level. In the delay circuit, an OR-logic output of the internal signal S10 in the OR gates 35 and 37 in the complex gate and the inverted delay signal S38 becomes low level. The signal S34 in the gate chain is transferred from the high level to the low level with a time delay corresponding to two stages of the input point of the inverter 33 to the output point of the inverter 34. Next, the signal S36 is transferred from the high level to the low level at a time "t43" delayed with a time corresponding to four stages of the input point of the NAND gate 31 to the output point of the inverter 36. Finally, the inverted delay signal S38 is transferred from the low level to the high level with a time delay corresponding to five stages of the input point of the NAND gate to the output point of the inverter 38, whereby the delay circuit 30 is reset.

As a result of those sequential operations, a sub-clock signal CLK2b is outputted which is risen in synchronizing with rising the system clock signal CLK1 and has a predetermined high level width identical with the inverted delay time "tdD" in the delay circuit 30.

Subsequently, operations, as the present clock signal generator circuit is applied to the B-system, will be described. With reference to FIG. 6, as at a time "t50", the system clock signal CLK1 is risen from the low level to the high level, the sub-clock signal CLK2b is risen at the same time "t50" in synchronizing with rising the system clock signal CLK1 as similarly to the operations in the A-system.

Thereafter, the system clock signal CLK1 or the internal signal S10 is fallen from the high level to the low level at a time "t51" before the internal signal S10 inputted to the first stage inverter 33 in the gate chain of the delay circuit reaches an output point of the inverter 38 on the final state of the gate chain. At this time, if the time period from the time "t50" to the time "t51" is not less than a time corresponding to two stages of the input point of the inverter 3 to the output point of the inverter 4 in the latch circuit 40. The sub-clock signal CLK2b as the output from the latch circuit is kept high level even the internal signal S10 is fallen to the low level.

Subsequently, at a time "t50", the internal signal S10 inputted into the gate chain reaches an output point of the final stage inverter 38 of the gate chain, whereby the inverted delay signal S38 is fallen from the high level to the low level. The latch is released whereby the sub-clock signal CLK2b is fallen to the low level at the same time "t52". Further in the complex gate in the delay circuit, an OR-logic output of the internal signal S10 and the inverted delay signal S38 by the two-input OR-gate 37 becomes low level. The inverted delay signal S38 is risen again from the low level to the high level at a time "t54" delayed with a time corresponding to five stages of the input point of the NAND agate 32 to the output point of the inverter 38. On the other hand, in the latch circuit 40, at the time "t52", the inverted delay signal S38 is transferred to the low level whereby at the same time "t52" the sub-clock signal CLK2b is transferred to the low level. In response thereto, the delay signal S4 of the sub-clock signal CLK2b as one input to the OR-gate 29 is fallen from the high level to the low level at the time "t53" delayed with a time corresponding to two stages of the input point of the inverter 3 to the inverter 4 from the time "t52". An OR-logic output of the signal S4 and the internal signal S10 by the OR-gate 29 in the latch circuit is transferred to the low level. As a result, the output from the OR-gate 29 has already been in the low level at the time "t53" prior to when the delay circuit 30 is reset and the inverted delay signal S38 is transferred to the high level for the next cycle at the time "t54". Accordingly, no malfunction appears that the sub-clock signal CLK2b is risen at a different timing from the predetermined timing.

In this clock signal generator circuit, even if the high level width of the system clock signal CLK1 is less than the delay time "tdD" in the delay circuit, a sub-clock signal CLK2b can be generated at a predetermined timing and with a predetermined high level width, provided that this is more than the delay time corresponding to two stages of the input point of the inverter 3 to the output point of the inverter 4.

Operations as the present clock signal generator circuit is applied to the C-system will be described. With reference to FIG. 6, at a time "t60", the system clock signal CLK1 is risen from the low level to the high level, whereby the sub-clock signal CLK2b is risen to the high level in synchronizing with rising the system clock signal CLK1 at the time "t60" through the same operations as described in the A-system. At a time "t61", the sub-clock signal CLK2b is fallen to the low level in synchronizing with transfer of the inverted delay signal S38 from the high level to the low level. The sub-clock signal CLK2b is outputted which has a predetermined rising timing and a predetermined high level width.

Thereafter, at a time "t62", the system clock signal CLK1 is fallen from the high level to the low level, through the similar operations at the time "t42" to the time "t43" in the A-system, the delay circuit 30 is reset with a time corresponding to five stages at a time "t64". In the next cycle which starts at a time "t65", the sub-clock signal CLK2b is generated with the predetermined rising timing and the predetermined high level width similarly to the operations at the time "t40" to the time "t41" in the A-system.

Figure 8:
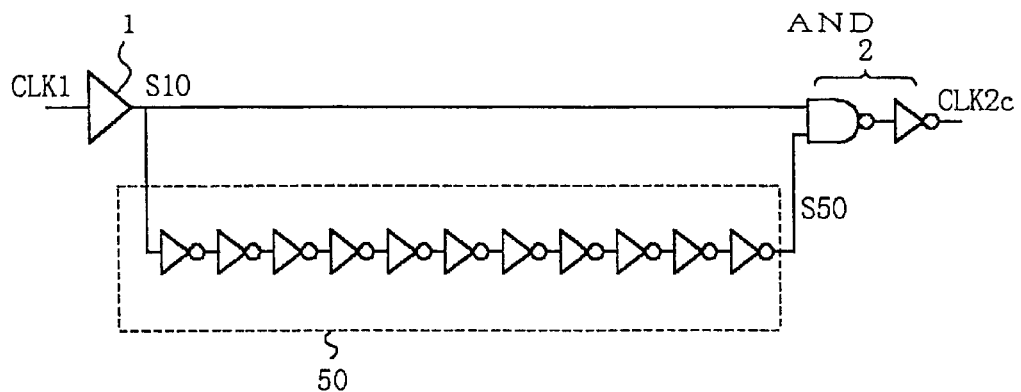
FIG. 8 is a circuit diagram illustrative of a conventional clock signal generator circuit.
Figure 9:
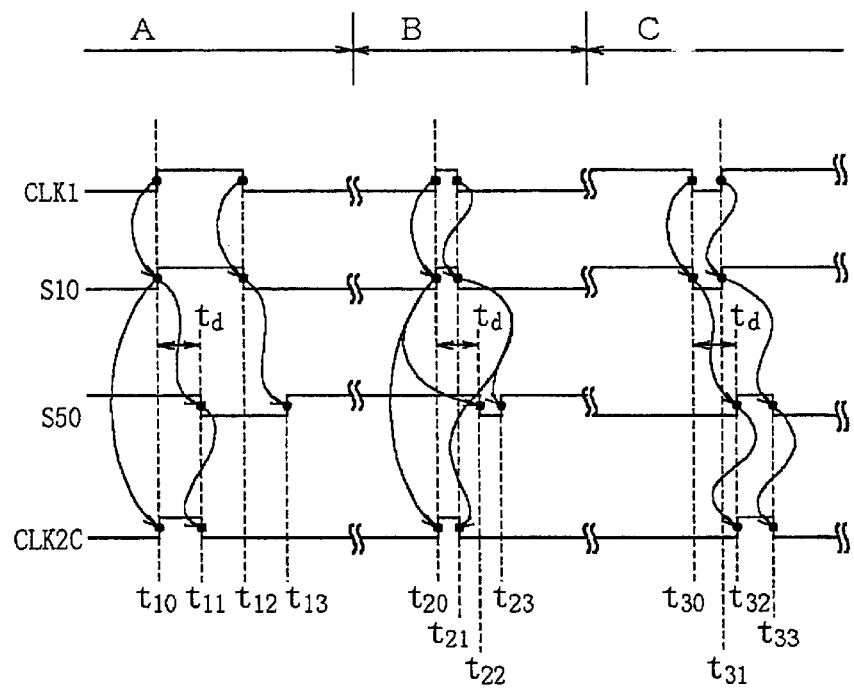
FIG. 9 is a timing chart of the clock signal generator circuit of FIG. 8.

In this clock signal generator circuit in this embodiment, if in place of the delay circuit 30, the delay circuit 50 in the conventional clock signal generator circuit shown in FIG. 8 is used, the responsibility to the various system is higher on the same ground described above, In this case, in addition to the A-system, it is possible to respond the B-system where the high level width o the system clock signal CLK1 is narrow.

In the clock signal generator circuits in the first and second embodiments, two of the reset complex gates are provided for each of the holding circuit 20 and the delay circuit 30. The number of the complex gates should not be limited to this. As the number of the complex gates is increased, the necessary time for resetting the circuits 20 and 30 is shortened thereby improving the productivity, even the circuit is complicated. By contrast, the number of the complex gates is decreased, the necessary time for reset is made longer, even the circuit is simplified. The number of the complex gates may be optional in response to the characteristics of the circuit.

A clock signal generator circuit is provided with an inverting delaying means for inverting and delaying a main clock signal externally given to generate an AND logic signal of the main clock signal and an inverted delay signal thereof, for generating a sub-clock signal which rises from a low level to a high level in synchronizing with a transfer of the main clock signal from the low level to the high level and also falls from the high level to the low level in synchronizing with another transfer of the main clock signal from the high level to the low level, wherein a holding means is provided for holding the main clock signal at the high level for at least a time more than a delay time by said inverted delay means after transferred from the low level.

In accordance with the present invention, it is possible to respond to the system where the high level width of the system clock signal is shorter than a delay time of the inverted delay means, a sub-clock signal with a predetermined rising timing and a predetermined high level width can be generated, whereby a responsibility to various systems is improved.

In a clock signal generator circuit in accordance with the present invention, the above inverted delay means is provided with a reset means for transferring the system clock signal from the high level to the low level or the inverted delay signal outputted from the inverting delaying means from the high level to the low level for compulsory returning to an initial state in a shorter time than the delay time of the inverting delaying means.

In accordance with the present invention, it is possible to respond to the system where the low level width of the system clock signal is shorter than a delay time of the inverted delay means, a sub-clock signal with a predetermined rising timing and a predetermined high level width can be generated, whereby a responsibility to various systems is improved.

In a clock signal generator circuit in accordance with the present invention, further both the above bolding means and the above inverted delay means are provided so that the holding means compulsory resets with an output signal from the inverted delay means.

In accordance with the present invention, it is possible to respond to either a system where the high level width of the system clock signal is shorter than a delay time of the inverted delay means, or a system where the low level width of the system clock signal is shorter than a delay time of the inverted delay means, whereby a sub-clock signal with a predetermined rising timing and a predetermined high level width can be generated, whereby a responsibility to various systems is improved.

What is claimed is:

1. A clock signal generator circuit provided with an inverting delaying means for inverting and delaying a main clock signal externally given to generate an AND logic signal of said main clock signal and an inverted delay signal thereof, for generating a sub-clock signal which transfers from a first level to a second level in synchronization with a transfer of said main clock signal from said first level to said second level and also transfers from said second level to said first level in synchronization with another transfer of said main clock signal from said second level to said first level, wherein a holding means is provided for holding said main clock signal, after transferred from said first level, at said second level for at least a time more than a delay time by said inverted delay means, and wherein said holding means is provided with a reset means for transferring said inverted delay signal outputted from said inverting delaying means from said second level to said first level for compulsory returning to an initial state.

2. A clock signal generator circuit provided with an inverting delaying means for inverting and delaying a main clock signal externally given to generate an AND logic signal of said main clock signal and an inverted delay signal thereof, for generating a sub-clock signal which transfers from a first level to a second level in synchronizing with a transfer of said main clock signal from said first level to said second level and also transfers from said second level to said first level in synchronizing with another transfer of said main clock signal from said second level to said first level, characterized in that said inverting delaying means is provided with a reset means for transferring said main clock signal from said second level to said first level or transferring said inverted delay signal outputted from said inverting delaying means from said second level to said first level for compulsory returning to an initial state for a shorter time than a delay time of said inverting delaying means.

3. A clock signal generator circuit provided with an inverting delaying means for inverting and delaying a main clock signal externally given to generate an AND logic signal of said main clock signal and an inverted delay signal thereof, for generating a sub-clock signal which transfers from a first level to a second level in synchronizing with a transfer of said main clock signal from said first level to said second level and also transfers from said second level to said fist level in synchronizing with another transfer of said main clock signal from said second level to said first level, characterized in that a holding means is provided for holding said main clock signal, after transferred from said first level, at said second level for at least a time more than a delay time by said inverted delay means, that said inverting delaying means is provided with a reset means for transferring said main clock signal from said second level to said first level or transferring said inverted delay signal outputted from said inverting delaying means from said second level to said first level for compulsory returning to an initial state for a shorter time than a delay time of said inverting delaying means, and that said holding means is provided with a reset means for transferring said inverted delay signal from said second level to said first level for compulsory returning to an initial state prior to a reset of said inverting delaying means.

4. A clock generator circuit comprising:

an inverting delaying means including an inverting and delaying gate chain for an inversion and delay for inverting and delaying signals;

a holding means comprising a holding and delaying gate chain for non-inversion and delay of said signals and said gate chain inserted at its intermediate position with a two-input OR-gate having one input of a signal propagating through said gate chain; and a two-input AND gate on an output stage, wherein an externally given main clock signal is inputted into input points of said inverting and delaying gate chain and said holding and delaying gate chain and also inputted into another input point of said OR-gate on said holding and delaying gate chain, an OR-logic signal of an output signal from said holding and delaying gate chain and said main clock signal and an output signal from said inverting and delaying gate chain are inputted as two signals into said AND gate on said output stage, and an AND logic signal generated by said AND gate is outputted as a sub-clock signal externally.

5. A clock generator circuit comprising:

an inverting delaying means including an inverting and delaying gate chain for an inversion and delay for inverting and delaying signals;

a holding means comprising a holding and delaying gate chain for non-inversion and delay of said signals and said gate chain inserted at its intermediate position with a reset complex gate which comprises a two-input OR-gate having one input of a signal propagating through said gate chain, and a two-input NAND gate having one input of an output signal from said two-input OR-gate; and a two-input AND gate on an output stage, wherein an externally given main clock signal is inputted into input points of said inverting and delaying gate chain and said holding and delaying gate chain and also inputted into another input point of said OR-gate of said reset complex gate, an output signal from said inverting and delaying gate chain is inputted into another input of said two-input NAND gate of said reset complex gate;

an OR-logic signal of an output signal from said holding and delaying gate chain and said main clock signal and an output signal from said inverting and delaying gate chain are inputted as two signals into said AND gate on said output stage, and an AND logic signal generated by said AND gate is outputted as a sub-clock signal externally.

6. A clock generator circuit comprising:

an inverting delaying means including an inverting and delaying gate chain for an inversion and delay for inverting and delaying signals;

a latching means having a two-input OR-gate and a two-input AND-gate having one input of an output signal from said two-input OR-gate on an output stage, so that a non-inverted delay signal to an AND-logic signal generated by said AND-gate is fed back to one input point of said two-input OR-gate for latching said AND logic signal or releasing said AND logic signal from the latch in response to another input into said AND gate, wherein an externally given main clock signal is inputted into an input point of said inverting and delaying gate chain and also inputted into another input point of said two-input OR-gate of said latch means, an output signal from said inverting and delaying gate chain is inputted into another input of said two-input NAND gate of said reset complex gate as well as an output signal from said inverting and delaying gate chain is inputted into another input point of said AND gate on said output stage, and an AND logic signal generated by said AND gate is outputted as a sub-clock signal externally.

7. A clock generator circuit comprising:

an inverting delaying means including an inverting and delaying gate chain for inverting and delaying signals, and inverting and delaying gate chain being inserted at its intermediate position with a reset complex gate which comprises a two-input OR-gate and a two-input NAND gate having one input of an output signal from said two-input OR-gate and another input of a signal propagating through said gate chain; and a two-input AND gate on an output stage, wherein an externally given main clock signal is inputted into an input point of said inverting and delaying gate chain and one input point of said AND gate on said output stage as well as an output signal from said inverting and delaying gate chain is inputted into another input point of said AND-gate and further said main clock signal and said output signal from said inverting and delaying gate chain are inputted as two signals into said two-input OR gate of said reset complex gate, and an AND logic signal generated by said AND gate on said output stage is outputted as a sub-clock signal externally.

8. A clock generator circuit comprising:

an inverting delaying means including an inverting and delaying gate chain for inverting and delaying signals, and inverting and delaying gate chain being inserted at its intermediate position with a first reset complex gate which comprises a two-input OR-gate and a two-input NAND gate having one input of an output signal from said two-input OR-gate and another input of a signal propagating through said gate chain;

a holding means comprising a holding and delaying gate chain for non-inversion and delay of said signals and said gate chain inserted at its intermediate position with a second reset complex gate which comprises a two-input OR-gate having one input of a signal propagating through said gate chain, and a two-input NAND gate having one input of an output signal from said two-input OR-gate and a two-input AND gate on an output stage, wherein an externally given main clock signal is inputted into input points of said inverting and delaying gate chain and of said holding and delaying gate chain and also inputted into another input point of said two-input OR-gate of said second complex gate as well as one input point of said two-input OR-gate of said first complex gate, an output signal from said inverting and delaying gate chain is inputted into another input point of said two-input AND-gate of said second complex gate and also another input point of said two-input OR-gate of said first complex gate, an OR-logic signal of said main clock signal and said output signal from said holding and delaying gate chain and an output signal from said inverting and delaying gate chain are inputted as two signals into said AND-gate on said output stage, and an AND logic signal generated by said AND gate on said output stage is outputted as a sub-clock signal externally.

9. A clock generator circuit comprising:

an inverting delaying means including an inverting and delaying gate chain for inverting and delaying signals, and inverting and delaying gate chain being inserted at its intermediate position with a first reset complex gate which comprises a two-input OR-gate and a two-input NAND gate having one input of an output signal from said two-input OR-gate and another input of a signal propagating through said gate chain;

a latching means having a two-input OR-gate and a two-input AND-gate having one input of an output signal from said two-input OR-gate on an output stage, so that a non-inverted delay signal to an AND-logic signal generated by said AND-gate is fed back to one input point of said two-input OR-gate for latching said AND logic signal or releasing said AND logic signal from the latch in response to another input into said AND gate, wherein an externally given main clock signal is inputted into an input point of said inverting and delaying gate chain and also inputted into another input point of said two-input OR-gate of said latch means, an output signal from said inverting and delaying gate chain is inputted into another input of said two-input NAND gate of said reset complex gate as well as an output signal from said inverting and delaying gate chain is inputted into another input point of said AND gate on said output stage, and said main clock signal and said output signal from said inverting and delaying gate chain are inputted as two signals into said OR-gate of said reset complex gate, and an AND logic signal generated by said AND gate is outputted as a sub-clock signal externally.

* * * * *